(12) United States Patent
Nakao et al.

(10) Patent No.: US 10,959,467 B2
(45) Date of Patent: Mar. 30, 2021

(54) WEARABLE SMART DEVICE

(71) Applicant: TOYOBO CO., LTD., Osaka (JP)

(72) Inventors: Yuko Nakao, Shiga (JP); Satoshi Imahashi, Shiga (JP); Michihiko Irie, Shiga (JP); Takashi Kondo, Shiga (JP); Maki Kinami, Shiga (JP)

(73) Assignee: TOYOBO CO., LTD., Osaka (JP)

( * ) Notice: Subject to any disclaimer, the term of this patent is extended or adjusted under 35 U.S.C. 154(b) by 282 days.

(21) Appl. No.: 16/084,859

(22) PCT Filed: Mar. 7, 2017

(86) PCT No.: PCT/JP2017/009014
§ 371 (c)(1),
(2) Date: Sep. 13, 2018

(87) PCT Pub. No.: WO2017/159456
PCT Pub. Date: Sep. 21, 2017

(65) Prior Publication Data
US 2019/0053546 A1    Feb. 21, 2019

(30) Foreign Application Priority Data

Mar. 16, 2016 (JP) .............................. JP2016-052396
Mar. 16, 2016 (JP) .............................. JP2016-052397

(51) Int. Cl.
*A41D 1/00* (2018.01)
*A41B 1/08* (2006.01)
(Continued)

(52) U.S. Cl.
CPC ................ *A41D 1/005* (2013.01); *A41B 1/08* (2013.01); *A41D 1/00* (2013.01); *A41D 13/00* (2013.01);
(Continued)

(58) Field of Classification Search
CPC ...... H05K 1/0283; H05K 1/095; H05K 3/007; H05K 3/12; H05K 3/125; H05K 3/227;
(Continued)

(56) References Cited

U.S. PATENT DOCUMENTS 7,046,503 B2 *   5/2006   Hinoki ................... H01G 11/86
                                                                361/502
8,446,075 B2 *   5/2013   Takahashi .............. H02N 1/006
                                                                310/364

(Continued)

FOREIGN PATENT DOCUMENTS

CN      103959396      7/2014
EP      2 450 911      5/2012
(Continued)

OTHER PUBLICATIONS

International Search Report dated Jun. 6, 2017 in International (PCT) Application No. PCT/JP2017/009014.
(Continued)

*Primary Examiner* — Angel R Estrada
(74) *Attorney, Agent, or Firm* — Wenderoth, Lind & Ponack, L.L.P.

(57) ABSTRACT

The present invention provides to a wearable smart device having electrical wiring comprising a stretchable conductive composition having excellent in durability such as repeated bending properties and repeated twisting properties, a material for realizing the wearable smart device, and a method for producing the wearable start device.
An electrical wiring including a fine line having an electrical line interval of 1 mm or less, preferably the line width of less than 1 mm, is formed by printing a paste for forming a stretchable conductor containing metal-based conductive particles and a non-crosslinked elastomer, and further dried and cured at a low temperature condition of 120° C. for 30
(Continued)

minutes. As a result, the wearable smart device having electrical wiring constituted by fine lines without sagging of the edge is obtained.

12 Claims, 5 Drawing Sheets

(51) Int. Cl.
H01B 1/22 (2006.01)
H01B 3/00 (2006.01)
H05K 3/12 (2006.01)
H05K 3/00 (2006.01)
H05K 1/02 (2006.01)
H05K 1/09 (2006.01)
A41D 13/00 (2006.01)
H01B 13/00 (2006.01)
H05K 3/22 (2006.01)

(52) U.S. Cl.
CPC ........... H01B 1/22 (2013.01); H01B 13/0036 (2013.01); H05K 1/0283 (2013.01); H05K 1/095 (2013.01); H05K 3/007 (2013.01); H05K 3/12 (2013.01); A41D 2600/10 (2013.01); H05K 3/125 (2013.01); H05K 3/227 (2013.01); H05K 2201/0133 (2013.01); H05K 2201/0203 (2013.01); H05K 2201/0245 (2013.01); H05K 2201/035 (2013.01)

(58) Field of Classification Search
CPC ... H05K 2201/0133; H05K 2201/0203; H05K 2201/0245; H05K 2201/035; H01B 1/22; H01B 13/0036; H01B 1/24; A41D 1/005; A41D 1/00; A41D 13/00; A41D 2600/10; A41B 1/08; C08K 3/08; C08K 7/06; C08K 9/04
USPC .................................................. 174/69, 68.1
See application file for complete search history.

(56) References Cited

U.S. PATENT DOCUMENTS

| 9,761,349 | B2* | 9/2017 | Imahashi | ................ C08K 9/04 |
| 2005/0207096 | A1 | 9/2005 | Hinoki et al. | |
| 2012/0119626 | A1 | 5/2012 | Takahashi et al. | |
| 2016/0372230 | A1 | 12/2016 | Imahashi | |
| 2018/0192948 | A1 | 7/2018 | Okumura et al. | |

FOREIGN PATENT DOCUMENTS

| EP | 2 924 695 | | 9/2015 | |
| EP | 2924695 | A1 * | 9/2015 | ............. G01L 1/146 |
| JP | 3723565 | | 12/2005 | |
| JP | 2007-173226 | | 7/2007 | |
| JP | 2008-186590 | | 8/2008 | |
| JP | 2008-198425 | | 8/2008 | |
| JP | 2010-142413 | | 7/2010 | |
| JP | 2010-153364 | | 7/2010 | |
| JP | 2012-054192 | | 3/2012 | |
| JP | 2012-248399 | | 12/2012 | |
| JP | 2017-022237 | | 1/2017 | |
| WO | 2015/005204 | | 1/2015 | |

OTHER PUBLICATIONS

Jong-Hyun Ahn and Jung Ho Je, "Stretchable Electronics: Materials, Architectures and Integrations", J. Phys. D: Appl. Phys. 45 (2012) 103001 (14pp).
Kyoung-Yong Chun, Youngseok Oh, Jonghyun Rho, Jong-Hyun Ahn, Young-Jin Kim, Hyoung Ryeol Choi and Seunghyun Baik, "Highly Conductive, Printable and Stretchable Composite Films of Carbon Nanotubes and Silver", Nature Nanotechnology, 5, 853, Nov. 28, 2010.
Office Action dated Dec. 10, 2019 in corresponding Japanese Patent Application No. 2018-505833 with English-language translation.
Chinese Office Action dated Feb. 25, 2020 in corresponding Chinese Patent Application No. 201780016361.7 with English translation.
Extended European Search Report dated Oct. 22, 2019 in corresponding European Patent Application 17766457.0.
Tsuyoshi Sekitani et al, "Stretchable Active-Matrix Organic Light-Emitting Diode Display Using Printable Elastic Conductors", Nature Materials, vol. 8, No. 6, Jun. 1, 2009, pp. 494-499.
Office Action dated Jul. 3, 2019 in corresponding Chinese Patent Application No. 201780016361.7.
Office Action dated Jul. 15, 2019 in corresponding Korean Patent Application No. 10-2018-7028262.
Office Action dated Jul. 22, 2020 in corresponding Chinese Patent Application No. 201780016361.7 with English-language translation.

* cited by examiner

WEARABLE SMART DEVICE

TECHNICAL FIELD

The present invention relates to a wearable smart device that is used with an electronic function or an electric function being incorporated into a garment. In particular, the present invention relates to a wearable smart device including a stretchable electrical wiring and having a natural use feeling and a natural wearing feeling, and a method for producing the same.

Furthermore, the present invention relates to a conductive paste used for forming an electrical wiring having stretchability that is necessary for realizing a wearable smart device with a natural use feeling and a natural wearing feeling.

BACKGROUND ART

Recently, a wearable electronic device intended to use an electronic device having input/output function, calculation function, and communication function in a state of being very close to or in close contact with a body has been developed. As such a wearable electronic device, devices with an accessory-type shape such as a wristwatch, eyeglasses, and earphones, and a wearable smart device of textile-integrated device where electronic functions are incorporated into a garment are known. Moreover, a touch body-type or a skin patch-type wearable smart device being in close contact with a human body, and an implant-type wearable smart device expected to be embedded in a human body are being further developed.

An electrical wiring for supplying power or transmitting signals is necessary for an electronic device. In particular, for a textile-integrated wearable electronic device or a skin patch-type wearable device, the electrical wiring is also required to have stretchability in accordance with a stretchable garment or substrate. Usually, an electrical wiring made of a metal wire or metal foil inherently has no practical stretchability, and hence a technique for providing stretching capabilities in a pseudo manner by arranging a metal wire or metal foil in a wave shape or in a repeated horseshoes shape is employed.

In the case of the metal wire, it is possible to form a wiring by regarding the metal wire as an embroidery yarn and sewing it into a garment. However, it is clear that such a method is not suitable for mass production.

A method of forming a wiring by etching metal foil is common as a method for producing a printed wiring board. A method is known in which the metal foil is attached to a stretchable resin sheet, and a wave-shaped wire is formed in the same manner as in the printed wiring board to make a stretchable wiring in a pseudo manner (refer to Non-Patent Document 1). In this method, stretchability is given in a pseudo manner by twist deformation of the wave-shaped wiring portion. However, the metal foil varies also in the thickness direction due to the twist deformation, and thus if it is used as a part of a garment, the garment has highly uncomfortable wearing feeling, which is not preferable. In addition, when the metal foil undergoes excessive deformation due to washing or the like, permanent plastic deformation occurs in the metal foil, and the wiring may also have the problem of the durability.

As a method to realize a stretchable conductor wiring, a method using a special conductive paste has been proposed. In such a method, conductive particles such as silver particles, carbon particles, and carbon nanotubes, elastomer such as urethane resin with stretchability, natural rubber, or synthetic rubber, and a solvent etc. are kneaded to form a paste, and using the resulting paste, a wiring is printed and drawn on a garment directly or in combination with a stretchable film substrate or the like.

A conductive composition including metal-based conductive particles and a stretchable binder resin can macroscopically realize a stretchable conductor. From a microscopic viewpoint, in the conductive composition obtained from the above-mentioned paste, the resin binder portion is deformed upon receiving an external force, and the conductivity is maintained within a range in which the electrical chain of the conductive particles is not broken. The resistivity observed macroscopically is higher than that of metal wires or metal foil. However, since the composition itself has stretchability, the wiring is not required to have a shape like a wave-shaped wiring, and flexibility in the width and the thickness of the wiring increases. Therefore, on a practical level, it is possible to realize a wiring with a low resistance compared with a metal wire.

Patent Document 1 discloses a technique in which silver particles and silicone rubber are combined, and the conductive film on the silicone rubber substrate is further covered with silicone rubber to suppress degradation of conductivity during elongation. Patent Document 2 discloses a combination of silver particles and a polyurethane emulsion and that a conductive film with high conductivity and a high elongation ratio can be obtained. Furthermore, many examples have also been proposed in which improvement of characteristics is attempted by combining conductive particles having a high aspect ratio such as carbon nanotubes, silver particles, and the like.

Furthermore, Patent Document 3 discloses a technique for directly forming an electrical wiring in a garment using a printing method.

RELATED ART DOCUMENTS

Patent Documents

Patent Document 1: JP-A-2007-173226
Patent Document 2: JP-A-2012-54192
Patent Document 3: JP-B-3723565

Non-Patent Documents

Non-Patent Document 1: Jong-Hyun Ahn and Jung Ho Je, "Stretchable electronics: materials, architectures and integrations" J. Phys. D: Appl. Phys. 45 (2012) 103001
Non-Patent Document 2: Kyoung-Yong Chun, Youngseok Oh, Jonghyun Rho, Jong-Hyun Ahn, Young-Jin Kim, Hyoung Ryeol Choi and Seunghyun Baik, "Highly conductive, printable and stretchable composite films of carbon nanotubes and silver" Nature Nanotechnology, 5,853 (2010)

DISCLOSURE OF THE INVENTION

Problems to be Solved by the Invention

In the case of forming a wiring on a fabric constituting a garment using a stretchable conductor composition by a printing method, there are various differences from a similar technique, for example, the technique of forming a membrane circuit using a conductive paste, and such various differences lead to technical difficulties. Unlike a substrate such as a polyester film with relatively high dimensional accuracy and sufficient flatness, the fabric has a considerably uneven surface and low dimensional accuracy because it has flexibility. In addition, since the fabric is flexible also in the thickness direction, deformation due to print thickness also occurs, and it is almost difficult to form a wiring pattern with high precision. To address these problems, in the invention disclosed in the above-mentioned Patent Document 3, an underlying layer is first provided on the fabric to limit freedom in motion between the fibers of the fabric. In Patent Document 3 also, not all difficulties have been solved.

The stretchable conductor composition is mainly formed of metal-based conductive particles and a flexible resin. As such a stretchable conductor, a composition in which a crosslinked elastomer such as rubber is used as a resin binder, and carbon black or metal particles are blended is generally known. Such a stretchable conductor composition is formed via a paste or slurry obtained by mixing, dissolving and dispersing metal-based conductive particles and a precursor of the crosslinked elastomer, if necessary with a solvent or the like. When formed into a paste, a wiring pattern can be easily formed by screen printing or the like. However, when such a crosslinked elastomer is used as a resin binder, there is a necessity to impart a crosslinking structure to the binder resin during the process of drying and curing the paste. Therefore, a relatively high processing temperature is required, and sagging of an edge occurs in the curing process, so that it is difficult to reduce an interval between wires. As a substrate for the material having flexibility, needless to say, it is preferable to use a material having flexibility. However, since the material having flexibility generally has low heat resistance, it cannot be used for the material in which the crosslinking structure is formed in the curing process as described above.

The same applies also to the case of printing a conductive paste after forming an underlying layer on a fabric, the underlying layer has a role of giving a certain level of smoothness to the surface of the fabric and at the same time bonding between fibers constituting the fabric to limit a degree of freedom. The resin component constituting the underlying layer does not necessarily have high heat resistance because the resin itself needs to have flexibility. When the resin composition is exposed to a temperature at which a crosslinking reaction is sufficiently performed, there is a concern that the resin may melt and soften, causing troubles. In addition, a crosslinking agent contained in the conductive paste may diffuse into the underlying layer in the curing process, and a crosslinking reaction may occur in the underlying layer, so that the flexibility of the underlying layer may be lower than in the initial state.

On the other hand, when a crosslinking agent is not blended in the conductive paste, there is no need to raise the temperature up to a crosslinking reaction temperature, which allows options of material for a substrate to be printed to be expanded, but a coating film is not crosslinked and has an insufficient strength, so that an increase in resistance is large when repeatedly stretched. In addition, drying at a low temperature tends to result in insufficient drying, and there is a concern that satisfactory physical properties of the coating film cannot be obtained due to a residual solvent, or problems such as skin irritation may occur when worn as a garment.

Consequently, in a wearable smart device having an electrical wiring formed of such a stretchable conductor composition, the wiring must be formed to have a wider line width and a wider line interval, and hence a portion in which the wiring is formed has a stiff feeling. As a result of the wiring having a wider width, the wiring is poor in repeated bending resistance and repeated twisting resistance as compared with a wiring using conductive fibers such as metal thread.

Means for Solving the Problems

The inventors made intensive studies to achieve the above objects, and as a result, and accomplished the following invention.

That is, the present invention has the following constitution.

[1] A wearable smart device comprising a stretchable electrical wiring comprising a stretchable conductor composition capable of maintaining electrical continuity even after repeating 20% elongation 10 times, wherein the electrical wiring when unstretched has a line interval of 50 µm or more and 1 mm or less, and the electrical wiring has a ratio of width/thickness in a range of 1 to 50.

[2] The wearable smart device comprising a stretchable electrical wiring according to above [1], wherein the electrical wiring when unstretched has a line width of 50 µm or more and less than 1 mm.

[3] The wearable smart device comprising a stretchable electrical wiring according to above [1] or [2], wherein a portion of the stretchable conductor composition of the stretchable electrical wiring has a thickness in a range of 3 µm or more and 200 µm or less.

[4] The wearable smart device comprising a stretchable electrical wiring according to any of above [1] to [3], wherein a specific resistance of the stretchable conductor composition of the stretchable electrical wiring when unstretched is $1 \times 10^{-3}$ Ωcm or less.

[5] The wearable smart device comprising a stretchable electrical wiring according to any of above [1] to [4], wherein the stretchable conductor composition comprises substantially no solvent and comprises at least 40 to 90% by mass of conductive particles having an average particle diameter of 0.5 µm or more and 5 µm or less, and 15 to 60% by mass of a non-crosslinked elastomer.

[6] The wearable smart device comprising a stretchable electrical wiring according to any of above [1] to [5], wherein the stretchable conductor composition comprises substantially no solvent and comprises at least 40 to 83% by mass of conductive particles having an average particle diameter of 0.5 µm or more and 5 µm or less, and 15 to 60% by mass of a non-crosslinked elastomer.

[7] The wearable smart device comprising a stretchable electrical wiring according to any of above [1] to [6], wherein the stretchable conductor composition comprises substantially no solvent and comprises at least 40 to 90% by mass of conductive particles having an average particle diameter of 0.5 µm or more and 5 µm or less, 15 to 60% by mass of a non-crosslinked elastomer, and 0.5 to 3% by mass of carbon black having a BET specific surface area of 100 to 550 $m^2$/g.

Further, the present invention has the following constitution.

[8] A paste for forming a stretchable conductor comprising at least a metal-based conductive filler, a non-crosslinked elastomer, and an organic solvent, wherein the metal-based conductive filler has an average particle diameter of 0.5 µm or more and 5 µm or less.

[9] The paste for forming a stretchable conductor according to claim 8 comprising at least a metal-based conductive filler, carbon black, a non-crosslinked elastomer, and an organic solvent, wherein the metal-based conductive filler has an average particle diameter of 0.5 µm or more and 5 µm or less, wherein the carbon black has a DBP oil absorption in a range of 100 to 550 cm$^3$/100 g, and wherein an amount ratio of the carbon black is 0.5 to 2.0% by mass relative to an amount of the metal-based filler.

[10] The paste for forming a stretchable conductor according to above [8] or [9], wherein when a total amount of all components except the solvent is 100 parts by mass, a total amount of the metal-based conductive filler and the carbon black is 40 to 90 parts by mass, and an amount of the non-crosslinked elastomer is 10 to 60 parts by mass.

[11] The paste for forming a stretchable conductor according to any of above [8] to [10], wherein the organic solvent has a boiling point of 200° C. or higher and a saturated vapor pressure at 20° C. of 20 Pa or less.

[12] A method for producing a stretchable electrical wiring, the method comprising:

forming an electrical wiring having a line width of less than 1 mm and a line interval of 1 mm or less by a printing method using the paste for forming a stretchable conductor according to any of above [8] to [11], and then drying the electrical wiring at a temperature in a range of 75° C. to 145° C. under atmospheric pressure.

Effects of the Invention

The wearable smart device according to the present invention is a garment-type device having an electrical wiring formed of a stretchable conductor composition, wherein the electrical wiring formed of a stretchable conductor composition has a relatively fine wiring of a line interval of 50 µm or more and less than 1 mm and an aspect ratio in the range of 1 to 50, the aspect ratio being defined by a width/thickness of the electrical wiring. The electrical wiring preferably has a line width of 50 µm or more and 1 mm or less and a thickness of 3 µm or more and 200 µm or less, and more preferably, and the specific resistance when unstretched of the stretchable conductor composition constituting the wiring is 1×10$^{-3}$ Ωcm or less.

As for the stretchable conductor composition of the formulated system used in the present invention, it is known that the contact state between particles changes due to repeated stretching and repeated bending, and hence the conductivity decreases. However, if the present invention is applied, the wiring cross-sectional area necessary for securing a predetermined wiring current capacity is provided not as a single thick wiring path, but by dividing into a plurality of thin wires such that the total sum of the wiring cross-sectional areas becomes equal, whereby it is possible to maintain the almost same current capacity and obtain a wiring excellent in repeated bending resistance and repeated twisting resistance. Improvement of repeated bending resistance and repeated twisting resistance can be easily inferred from examples of electrical wires using general conductors. However, surprisingly, it has been confirmed that repeated stretching resistance is also improved according to the configuration of the present invention. The present inventors interpreted this effect as the combined effect of finely dividing the wiring path, using a non-crosslinked elastomer as a binder component of the stretchable conductive composition used for the wiring, and drying and curing it at a low temperature.

The advantageous effects of the present invention also contribute to improvement of the washing resistance of the wiring. Elongation deformation and compressive deformation are repeatedly exerted on the wiring portion during washing. The stretchable conductor composition made of a conductive filler and a binder resin is prone to cause buckling failure particularly due to compression, and therefore washing resistance may be often lowered. However, the inventors understood that resistance against a compression in the width direction of the wiring portion is greatly improved by dividing the wiring with an appropriate line interval as in the present invention, and as a result, the washing durability is improved.

In a garment incorporating an electrical wiring, discomfort of the wiring portion when be worn has become a problem. It may easily be imagined that discomfort is large when wearing a garment having a wiring in which a fine metal wire is sewn.

When a conductive paste for forming a stretchable conductor using a crosslinked elastomer resin as a binder is printed, dried and cured, if a temperature for drying and curing is set high, a phenomenon that the resin viscosity temporarily decreases in the course of the crosslinking reaction of the resin component occurs. This is because that the polymer chain of the resin must have sufficient mobility in order for the crosslinking reaction to be carried out smoothly, and it is necessary to inevitably undergo a state in which the resin viscosity decreases. This temporary decrease in resin viscosity causes sagging of the edge of the wiring pattern, the cross-sectional shape of the wiring is deformed from the initially formed shape, and more frankly speaking, even if the wiring is initially formed into a fine line shape, the line width becomes thicker in the curing process, resulting in difficulty in obtaining a fine line pattern.

Since a non-crosslinked elastomer resin is used as a binder in the present invention, it is possible to avoid the above-mentioned problem. However, if the drying temperature is lowered, a coating film is not crosslinked, so that the strength of the coating film is insufficient, and an increase in resistance when stretched is large. In addition, since drying also becomes insufficient, when a solvent having a high boiling point is used, the solvent component tends to remain. In order to adapt to low-temperature drying, it is required to be formulated such that the coating strength is increases without crosslinking, screen printing can be performed, and the solvent does not remain in the coating film. The use of a solvent having a low boiling point tends to cause an increase in a paste viscosity during printing and generate blurs or the like in printing. On the other hand, the use of a solvent having a high boiling point has concerns that various problems related to a residual solvent may be caused. In the paste for forming a stretchable conductor of the present invention, the coating film strength is increased by containing carbon black having a specific DBP oil absorption in a predetermined amount, so that the increase in resistance when stretched can be suppressed, and defects in the coating film caused by the residual solvent can be avoided. It is considered that this is because the specific carbon black absorbs the residual solvent, and the content of free solvent present in the resin system is reduced.

In the present invention, since the above-mentioned concern is avoided by using the specific carbon black, it is possible to use a solvent having a relatively high boiling point while improving the strength of the coating film even when curing is performed at a low temperature. By using the solvent having a high boiling point, the change in viscosity of a paste is reduced, the problem of dryness of a plate can be avoided, and in addition, offset onto the printing plate is reduced, and the increase in viscosity of the paste does not noticeably occur, so that workability at the time of printing is improved. Combined with improvement in workability, sagging of the edge of the paste is suppressed by a decrease in temperature for drying, so that printability of fine lines is improved. As a result, by using the conductive paste of the present invention, a wiring with a line width of 300 μm or less, preferably 180 μm or less can be printed, and furthermore, a fine pattern with a line interval of 150 μm or less, preferably 80 μm or less, and more preferably 50 μm or less can be printed.

A wiring path composed of a sheet or film of the stretchable conductor composition according to the present invention is relatively thin and thus has a small discomfort. In addition, according to the present invention, the flexibility of the wiring portion can be improved by dividing the wiring into fine lines, and a natural wearing feeling without discomfort can be realized.

MODE FOR CARRYING OUT THE INVENTION

Figure 1:
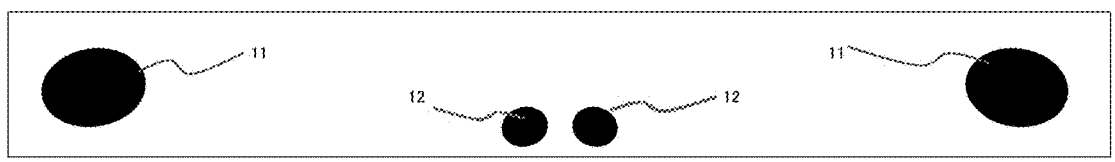
FIG. 1 is a view showing a printed pattern of an electrode surface layer in Examples of the present invention.

In the present invention, the electrical wiring composed of fine lines can be realized based on the following concept.

The electrical wiring in the present invention is obtained by printing and curing a paste for forming a stretchable conductor. Since materials such as fabric composed of flexible substrates, and stretchable sheets generally have poor heat resistance, a temperature of drying and curing a paste needs to be kept low, and a solvent having a low boiling point is generally used as a solvent for the paste. Further, it is difficult to use a resin component that needs a curing reaction and a crosslinking reaction at high temperatures as a binder resin. However, the use of a solvent having a low boiling point tends to cause dryness of a plate during printing of the paste and easily generate blurs, and as a result, it becomes difficult to print a fine line.

In the present invention, such problems are solved by the physical properties obtained by using a solvent having a relatively high boiling point and using, as a binder resin, a non-crosslinked elastomer that sufficiently exhibits stretchability preferably even when dried at a low temperature, whereby a fine wiring having a line width of less than 1 mm, and preferably a line interval of 1 mm or less can be formed.

As the stretchable electrical wiring formed of the stretchable conductor composition in the present invention, materials are used which have stretch resistance that is capable of maintaining electrical continuity even after repeating 20% elongation 10 times, preferably even after repeating 20% elongation 100 times, and more preferably even after repeating 20% elongation 1000 times.

In the present invention, the electrical wiring when unstretched has a line interval of 50 μm or more and 1 mm or less, preferably 80 μm or more and 750 μm or less, and more preferably 120 μm or more and 450 μm or less. If the line interval exceeds this range, not only the packaging density of an electronic circuit becomes lower but also the irregularities of the wiring surface tend to be tactually noticeable, and discomfort may increase when worn as a garment. On the other hand, if the line interval is attempted to be less than this range, the frequency of washing a printing plate increases, and the yield decreases, resulting in insufficient productivity.

In the present invention, the electrical wiring has a width/thickness ratio (aspect ratio) in the range of 1 to 50, preferably 2 to 40, and more preferably 3 to 30. If the aspect ratio exceeds this range, the cross-sectional area of the wiring decreases, and it becomes difficult to ensure the required current capacity. On the other hand, when a wiring having a smaller aspect ratio than this range is formed, a method with low material efficiency such as a lift-off method must be adopted, and the productivity decreases.

The stretchable conductor formed from a paste for a stretchable conductor in the present invention preferably has a thickness of 3 to 200 μm, more preferably 4 to 120 μm, and still more preferably 5 to 60 μm.

Hereinafter, the stretchable conductor composition used in the present invention will be described.

The stretchable conductor composition in the present invention contains substantially no solvent and contains at least 40 to 90% by mass of conductive particles having an average particle diameter of 0.5 μm or more and 5 μm or less, and 15 to 60% by mass of a non-crosslinked elastomer.

Furthermore, the stretchable conductor composition in the present invention preferably contains substantially no solvent and contains at least 40 to 83% by mass of conductive particles having an average particle diameter of 0.5 μm or more and 5 μm or less, 15 to 60% by mass of a non-crosslinked elastomer, and 2 to 25% by mass of non-conductive particles having an average particle diameter of 0.3 μm or more and 10 μm or less.

In addition, the stretchable conductor composition in the present invention is preferably molded as a wiring of a wearable smart device via at least the step of drying and curing a paste composition at a temperature of 60 to 120° C. for 300 to 1800 seconds, the paste composition containing 20 to 80 parts by mass of an organic solvent having a boiling point of 200° C. or higher and a saturated vapor pressure at 20° C. of 20 Pa or less, when the total amount of the conductive particles, the non-crosslinked elastomer and the non-conductive particles is 100 parts by mass.

The conductive particles in the present invention are composed of a material having a specific resistance of $1 \times 10^{-2}$ Ωcm or less and have a particle diameter of 0.5 μm or more and 5 μm or less. Examples of the material having a specific resistance of $1 \times 10^{-2}$ Ωcm or less include metal, alloy, doped semiconductor, and the like. As the conductive particles preferably used in the present invention, metals such as silver, gold, platinum, palladium, copper, nickel, aluminum, zinc, lead, and tin; alloy particles such as brass, bronze, cupronickel, and solder; hybrid particles such as silver-coated copper; in addition metal-plated polymer particles, metal-plated glass particles, metal-coated ceramic particles, and the like can be used.

In the present invention, it is preferred to mainly use flaky silver particles or an irregular-shaped aggregated silver powder. Here, the "mainly use" means that the amount of 90% by mass or more of the conductive particles is used. The irregular-shaped aggregated powder is made by three-dimensional aggregation of spherical or irregular-shaped primary particles. The irregular-shaped aggregated powder and the flaky powder are preferable because they have a specific surface area larger than that of spherical powder or the like, and hence an electrical conductivity network can be formed even when the filling amount is small. The irregular-shaped aggregated powder, which is not in a monodisperse form, is further preferable because the particles physically contact with each other, and hence an electrical conductivity network can be easily formed.

As for the particle diameter of the conductive particles, the average particle diameter (50% D) measured by a dynamic light scattering method is preferably 0.5 to 5 μm, and more preferably 0.7 to 3 μm. If the average particle diameter exceeds the predetermined range, the formation of a fine wiring may become difficult, and clogging occurs in the case of screen printing or the like. If the average particle diameter is less than 0.5 μm, the particles cannot contact with each other when the filling amount is small, and as a result, the electrical conductivity may deteriorate.

In the present invention, carbon black having a DBP oil absorption in the range of 100 to 550 is used.

There are many types of carbon blacks made from different raw materials or by different methods, and each has its own characteristics. The DBP oil absorption is a parameter indicating the liquid absorption and retention ability of carbon black and is determined based on ISO 4656: 2012. In the present invention, the DBP oil absorption is preferably 160 or more and 530 or less, more preferably 210 or more and 510 or less, and still more preferably 260 or more and 500 or less. If the DBP oil absorption is less than this range, an interval between lines tends to be buried when fine lines are printed, and the printability of fine lines is deteriorated. If the DBP oil absorption exceeds this range, the viscosity of the paste tends to rise easily, and there arises a need to increase the amount ratio of the solvent for adjusting the viscosity. As a result, when fine lines are printed, the solvent tends to bleed between the lines, and likewise, the printability of fine lines is deteriorated.

The amount ratio of carbon black is 0.5% by mass or more and 2.0% by mass or less, and preferably 0.7% by mass or more and 1.6% by mass or less relative to the total amount of the metal-based filler and the carbon black.

In the present invention, non-conductive particles having an average particle diameter of 0.3 μm or more and 10 μm or less may be contained. As the non-conductive particles in the present invention, metal oxide particles are mainly used, and examples thereof include silicon oxide, titanium oxide, magnesium oxide, calcium oxide, aluminum oxide, iron oxide, metal sulfate, metal carbonate, metal titanate, and the like. Among these non-conductive particles, barium sulfate particles are preferably used in the present invention.

As the non-crosslinked elastomer in the present invention, a thermoplastic elastomer resin having preferably an elastic modulus of 1 to 1000 MPa and preferably a glass transition temperature within the range of −40° C. to 0° C. can be used, and examples thereof include thermoplastic synthetic resin, synthetic rubber, natural rubber, and the like. In order to develop the stretchability of a coating film (sheet), rubbers and polyester resin are preferably used. Examples of the rubbers include urethane rubber, acrylic rubber, silicone rubber, butadiene rubber, rubber containing a nitrile group such as nitrile rubber or hydrogenated nitrile rubber, isoprene rubber, vulcanized rubber, styrene-butadiene rubber, butyl rubber, chlorosulfonated polyethylene rubber, ethylene propylene rubber, vinylidene fluoride copolymer, and the like. Among these, rubber containing a nitrile group, chloroprene rubber, chlorosulfonated polyethylene rubber, and styrene-butadiene rubber are preferable, and rubber containing a nitrile group is particularly preferable.

The elastic modulus of the flexible resin is preferably 3 to 600 MPa, more preferably 10 to 500 MPa, further preferably 15 to 300 MPa, even more preferably 20 to 150 MPa, and particularly preferably 25 to 100 MPa.

There is no particular limitation for the rubber containing a nitrile group as far as it is a rubber or elastomer containing a nitrile group, and nitrile rubber and hydrogenated nitrile rubber are preferable. Nitrile rubber is a copolymer of butadiene with acrylonitrile, and when the amount of bonding acrylonitrile increases, affinity with metal increases, but rubber elasticity contributing to stretchability rather decreases. Therefore, the amount of bowling acrylonitrile is preferably 18 to 50% by mass, more preferably 30 to 50% by mass, and still more preferably 40 to 50% by mass in 100% by mass of the nitrile-containing rubber (for example, acrylonitrile butadiene copolymer rubber).

The polyester resin and the urethane rubber preferably have a glass transition temperature of from −40° C. to 0° C. They also preferably have a block copolymer structure composed of a hard segment and a soft segment. The elastic modulus of the non-crosslinked elastomer in the present invention is preferably in the range of 1 to 1000 MPa, more preferably 3 to 600 MPa, further preferably 10 to 500 MPa, and still more preferably 30 to 300 MPa. The non-crosslinked elastomer in the present invention preferably has a glass transition temperature of 0° C. or lower, more preferably −5° C. or lower, and further preferably −10° C. or lower. The non-crosslinked elastomer in the present invention preferably has a glass transition temperature of 0° C. or lower, and more preferably in the range of from −40° C. to 0° C.

In the paste for forming a stretchable conductor of the present invention, when the total amount of all components except the solvent is 100 parts by mass, the total amount of the metal-based conductive filler and the carbon black is 70 to 90 parts by mass, and the amount of the non-crosslinked elastomer is 10 to 30 parts by mass.

The paste for forming a stretchable conductor in the present invention contains a solvent. The solvent used in the present invention is an organic solvent having a boiling point of 200° C. or higher and a saturated vapor pressure at 20° C. of 20 Pa or less. When the boiling point of the organic solvent is too low, the solvent may be evaporated during the paste production process and during use of the paste, and there is a concern that the ratio of the ingredients constituting the conductive paste may be apt to change. On the other hand, when the boiling point of the organic solvent is too high, the amount of the solvent remaining in the dried and cured coat becomes large, and hence there is a concern that reliability of the coat may deteriorate. In addition, since a long period of time is taken for drying and curing, the sag of an edge in the drying process becomes large, so that it becomes difficult to keep the interval between lines narrow.

Specific examples of the organic solvent using in the present invention include benzyl alcohol (vapor pressure: 3 Pa, boiling point: 205° C.), terpionel (vapor pressure: 3.1 Pa, boiling point: 219° C.), diethylene glycol (vapor pressure: 0.11 Pa, boiling point: 245° C.), diethylene glycol monoethyl ether acetate (vapor pressure: 5.6 Pa, boiling point 217° C.), diethylene glycol monobutyl ether acetate (vapor pressure: 5.3 Pa, boiling point: 247° C.), diethylene glycol dibutyl ether (vapor pressure: 0.01 mmHg or less, boiling point: 255° C.), triethylene glycol (vapor pressure: 0.11 Pa, boiling point: 276° C.), triethylene glycol monomethyl ether (vapor pressure: 0.1 Pa or less, boiling point: 249° C.), triethylene glycol monoethyl ether (vapor pressure: 0.3 Pa, boiling point: 256° C.), triethylene glycol monobutyl ether (vapor pressure: 1 Pa, boiling point: 271° C.), tetraethylene glycol (vapor pressure: 1 Pa, boiling point: 327° C.), tetraethylene glycol monobutyl ether (vapor pressure: 0.01 Pa or less, boiling point: 304° C.), tripropylene glycol (vapor pressure: 0.01 Pa or less, boiling point: 267° C.), tripropylene glycol monomethyl ether (vapor pressure: 3 Pa, boiling point: 243° C.), and diethylene glycol monobutyl ether (vapor pressure: 3 Pa, boiling point: 230° C.).

In the present invention, the solvent may be used singly, or in combination of two or more thereof. Such organic solvents are appropriately contained such that the paste for forming a stretchable conductor composition has a viscosity suitable for printing or the like.

The amount ratio of the organic solvent in the present invention is 10 to 40 parts by mass, and preferably 10 to 25 parts by mass when the total mass of the conductive particles, the non-conductive particles, and the non-crosslinked elastomer is 100 parts by mass.

The paste for forming a stretchable conductor in the present invention can be prepared by mixing and dispersing the conductive particles, the non-conductive particles which may be preferably added, the non-crosslinked elastomer, and the solvent as materials with a disperser such as a dissolver, three-roll mill, rotation/revolution mixer, attritor, ball mill, sand mill or the like.

Into the paste for forming a stretchable conductor in the present invention, a known organic or inorganic additive such as a printability imparting agent, color tone adjusting agent, leveling agent, antioxidant, ultraviolet absorber, or the like can be blended as long as the contents of the invention are not impaired.

In the present invention, by printing an electrical wiring pattern directly on a fabric using the above-mentioned paste for forming a stretchable conductor, a garment having an electrical wiring formed of a stretchable conductor composition can be produced. As a printing method, a screen printing method, a lithographic offset printing method, a paste-jet method, a flexographic printing method, a gravure printing method, a gravure offset printing method, a stamping method, a stencil method, or the like may be used. In the present invention, it is preferred to use a screen printing method or a stencil method. A method to directly draw a wiring using a dispenser or the like may also be interpreted as a printing in a broad sense.

In the present invention, using the stretchable conductor paste thus obtained, an electrical wirings having a line width of less than 1 mm and a line interval of 500 μm or less is formed by a printing method, and then dried at a temperature in the range of 75° C. to 145° C. under atmospheric pressure, whereby a stretchable electrical wiring can be obtained.

A substrate used for printing is a stretchable substrate or a highly flexible material. The paste for forming a stretchable conductor in the present invention is suitably used for forming a stretchable electrical wiring on a flexible sheet of rubber, urethane or the like, or on a fabric such as woven fabric, knitted fabric, nonwoven fabric, synthetic leather, or the like, which is raw fabric of garments and textile products. The paste for forming a stretchable conductor can be also printed after a flexible resin material such as polyurethane resin or rubber is previously applied onto the whole or part of the fabric as an undercoat. Alternatively, the fabric may be temporarily hardened with a water-soluble resin or the like to facilitate handling and then subjected to printing. Furthermore, it may be temporarily fixed to a hard sheet material and then subjected to printing.

The stretchable electrical wiring formed of the stretchable conductor composition in the present invention maintains electrical continuity even after repeating 20% elongation 10 times, preferably even after repeating 20% elongation 100 times, and more preferably even after repeating 20% elongation 1000 times.

In the present invention, the electrical wiring when unstretched has a line width of less than 1 mm, preferably 500 μm or less, more preferably 250 μm or less, and further preferably 120 μm or less.

In the present invention, the electrical wiring when unstretched has a line interval of 50 μm or more and 1 mm or less, preferably 80 μm or more and 750 μm or less, and more preferably 120 μm or more and 450 μm or less. If the line interval exceeds this range, not only the packaging density of an electronic circuit becomes lower but also the irregularities of the wiring surface tend to be tactually noticeable, and discomfort may increase when worn as a garment. On the other hand, if the line interval is attempted to be less than this range, the frequency of washing a printing plate increases, and the yield decreases, resulting in insufficient productivity.

In the present invention, the electrical wiring has a width/thickness ratio (aspect ratio) in the range of 1 to 50, preferably 2 to 40, and more preferably 3 to 30. If the aspect ratio exceeds this range, the cross-sectional area of the wiring decreases, and it becomes difficult to ensure the required current capacity. On the other hand, when a wiring having a smaller aspect ratio than this range is formed, a method with low material efficiency such as a lift-off method must be adopted, and the productivity decreases.

By drying and curing the paste for forming a stretchable conductor composition thus obtained, an electrical wiring that contains substantially no solvent and has an elongation characteristic that maintains electrical conductivity even after repeating 20% elongation 10 times can be obtained.

As for the printing, a predetermined pattern may be printed on a fabric such as woven fabric, knitted fabric, nonwoven fabric, synthetic leather, or the like, which is raw fabric of garments and textile products, followed by cutting and sewing to obtain a textile product such as a garment, or may be also printed on a textile product that has been sewn or on an intermediate sewn product. The paste for forming a stretchable conductor can be also printed after a flexible resin material such as polyurethane resin or rubber is previously applied onto the whole or part of the fabric as an undercoat. Alternatively, the fabric may be temporarily hardened with a water-soluble resin or the like to facilitate handling and then subjected to printing. Furthermore, it may be temporarily fixed to a hard sheet material and then subjected to printing. In a garment with a wiring obtained by printing the paste for forming a stretchable conductor directly on a fabric, the undercoat and/or stretchable conductor portion and the fiber of the fabric that is a substrate are partly in an interpenetration state, so that strong adhesion can be realized. Moreover, also in the case of printing via an underlying layer, since a material having good adhesiveness to the stretchable conductor composition may be appropriately selected for the underlying layer, a garment including an electrical wiring layer having good adhesiveness can be obtained.

In the wiring formed of the stretchable conductor in the present invention, if necessary, an insulating cover coat having stretchability may be provided by a printing method or a lamination method. On the surface of an electrode intended to be in contact with a human body surface, a surface layer formed of a composition using carbon particles as a main component of the metal-based conductive particles may be provided. Such a composition using carbon particles as a main component of the metal-based conductive particles is preferably made of a carbon paste using the same flexible resin material as in the stretchable conductor in the present invention as a binder. In addition, a portion used as an electrical contact with a discrete component can be plated with gold, tin or the like.

In the present invention, using the paste for forming a stretchable conductor as described above, an electrical wiring pattern is printed on an intermediate medium, and then transferred to a fabric, whereby a garment having a wiring formed of a stretchable conductor composition can be obtained. Also in this case, a printing method similar to direct printing can be appropriately selected. Likewise, it is also possible to provide a cover coat layer, a composition layer using carbon particles as a main component of the metal-based conductive particles, and the like. When the transfer method is used, a transfer can be performed by thermocompression bonding to a fabric because the stretchable conductor in the present invention has thermoplastic properties. When the ease of transfer is further desired, a hot-melt layer as an underlying layer can be formed on the wiring pattern printed on the intermediate medium in advance, and then a transfer to a fabric can be performed. Furthermore, the hot-melt layer may be provided as an image receiving layer on the fabric side in advance. For such a hot-melt layer, a thermoplastic urethane resin or a non-crosslinked elastomer similar to the binder component of the stretchable conductor composition in the present invention can be used.

As the intermediate medium in this case, a so-called release sheet such as a polymer film or paper having a release layer on its surface may be used. In addition, it is possible to use a film, sheet, plate or the like having a surface made of a material poor in adhesiveness such as fluororesins, silicone resins, or polyimides. It is also possible to use a metal plate such as stainless steel, a hard chrome-plated steel plate, an aluminum plate or the like.

EXAMPLES

Hereinafter, the invention will be explained in more detail and specifically by further showing examples. Evaluation results etc. of examples were measured by the following method.

<Amount of Nitrile>
The amount of nitrile was converted from the composition ratio obtained by analyzing the resulting resin material by NMR to a ratio by mass (% by mass) of monomer.
<Mooney Viscosity>
The measurement was conducted using SMV-300RT "Mooney Viscometer" manufactured by Shimadzu Corporation.
<Elastic Modulus>
A resin material was heated, compressed and molded into a sheet having a thickness of 200±20 μm, and then punched out into a dumbbell shape defined by ISO 527-2-1A to obtain a test piece. A tensile test was performed by the method defined in ISO 527-1 to determine an elastic modulus.
<Glass Transition Temperature>
A glass transition temperature was determined by differential thermal analysis (DTA) according to ISO 3146.
<Average Particle Diameter>
The measured using a light-scattering particle size distribution analyzer LB-500 manufactured by Horiba, Ltd.
<Repeated Stretching Durability of Resin Material>
(1) Formation of Test Piece Sheet
A resin material was heated, compressed and molded into a sheet having a thickness of 200±20 μm, and then punched out into a dumbbell shape defined by ISO 527-2-1A to obtain a test piece.
(2) Stretching Test
An IPC bending tester manufactured by Yamashita Materials Corporation was modified, a reciprocating stroke of the tester was set to 13.2 mm, the test piece was fixed on a movable plate side with a clamp, the other end of the test piece was fixed to another fixed end with a clamp, and using a portion having a width of 10 mm and a length of 80 mm in the dumbbell-shaped test piece, an effective length was adjusted to be 66 mm (corresponding to 20% elongation). Using the apparatus modified to enable a sample to be repeatedly stretched, stretching of the test piece was repeatedly performed 100 times, and a change ratio of resistance values before and after the stretching test was determined according to the following equation:

$$\text{Resistance change ratio} = \text{resistance value after test}/\text{initial resistance value}.$$

<Evaluation of Stretching Durability>
(1) Formation of Test Piece Sheet
A non-yellowing polyurethane film "Unigrand XN 2004" manufactured by Nihon Unipolymer Co., Ltd. was lightly attached to a PET film having a thickness of 125 μm with a roll laminator to use as a substrate. Then, using a stainless steel screen plate of 300 mesh, a pattern in which 10 lines having a length of 200 mm and a line width/a line interval=500 μm/500 μm were arranged in parallel was printed and dried under predetermined conditions to prepare a test piece.
(2) Stretching Test
An IPC bending tester manufactured by Yamashita Materials Corporation was modified, a reciprocating stroke of the tester was set to 13.2 mm, the test piece was fixed on a movable plate made of insulating resin with a metal clamp, the other end of the test piece was fixed to another fixed end with a clamp, and an effective length was adjusted to be 66 mm (corresponding to 20% elongation) in the longitudinal direction of the test piece previously obtained. Using the apparatus modified to enable a sample to be repeatedly stretched, while monitoring the resistance value between the metal clamps, stretching was repeatedly performed 100 times, the resistance values before and after the stretching test were compared, and the resistance value after the stretching test was divided by the initial resistance value to determine a resistance change ratio of stretching durability.

<Repeated Stretching Durability of Conductive Paste>

A paste for forming a stretchable conductor was printed onto a sheet having a thickness of 200±20 µm obtained from a stretchable resin R1 as a substrate by screen printing to form a rectangular pattern of 180 mm×30 mm having a dry thickness of 30 µm, and dried and cured at 120° C. for 30 minutes. Next, the rectangular pattern portion was punched out into a dumbbell shape defined by ISO 527-2-1A to obtain a test piece.

An IPC bending tester manufactured by Yamashita Materials Corporation was modified, a reciprocating stroke of the tester was set to 13.2 mm, the test piece was fixed on a movable plate side with a clamp, the other end of the test piece was fixed to another fixed end with a clamp, and using a portion having a width of 10 mm and a length of 80 mm in the dumbbell-shaped test piece, an effective length was adjusted to be 66 mm (corresponding to 20% elongation). Using the apparatus modified to enable a sample to be repeatedly stretched, the test piece was clipped with metal clips on portions wrapped with aluminum foil at 0 to 5 mm outside from both ends of the stretching effective length of 66 mm, and was repeatedly stretched while monitoring resistance values with the tester. The resistance values were read every 10 times until repeated stretching of 600 times, and in stretchings of more than 600 times, stretching was stopped every 50 times in a state of a stretching rate of 0%, a value after one minute after the stop was read and recorded, the number of times at the time when the resistance value had reached 100-fold of the initial value was recorded, and then the test was aborted.

<Electrical conductivity (sheet resistance, specific resistance)>

The resistance value [Ω] of a part having a width of 10 mm and a length of 80 mm in the central portion of a dumbbell-shaped test piece defined by ISO 527-2-1A was measured using Milliohmmeter manufactured by Agilent Technologies, and a sheet resistance value "Ω square" was obtained by multiplying the measured resistance value by the aspect ratio (⅛) of the test piece.

Furthermore, by multiplying the resistance value [Ω] by a cross-sectional area (width of 1 [cm]× thickness [cm]) and then dividing by the length (8 cm), a specific resistance [Ω cm] was determined.

<Evaluation of Migration Resistance>

Using the conductive paste, a test pattern in which two conductor patterns having a width of 1.0 mm and a length of 30.0 mm were parallel at intervals of 1.0 mm was printed on a polyester film by screen printing, and cured to obtain a test piece. In a state where DC5V was applied between the electrodes of the test piece, deionized water was added dropwise between the conductors, and the time taken until the electrodes were short-circuited by dendritic precipitates was measured, and a case where the time was within 60 seconds was evaluated as "poor" and a case where the time was 60 seconds or longer was evaluated as "good". Note that the dropwise amount of deionized water was adjusted to an amount enough that water droplets cover in a width of 8 to 10 mm between the electrodes, and determination of short circuit was performed through visual observation.

<Wearing Feeling>

Ten adults including five men and five women served as test subjects, and a sports shirt in which an electrical wiring was formed was worn by each subject to measure an electrocardiogram. With regard to the wearing feeling during the measurement of electrocardiogram, the sensory evaluation was performed according to 5 grades from 5 points as "good feeling" to 1 point as "bad feeling". Averaging points of ten persons, a case of 4 or more points was evaluated as "very good", a case of 3 or more and less than 4 points was evaluated as "good", a case of 2 or more and less than 3 points was evaluated as "fair", a case of less than 2 points was evaluated as "poor".

<Composition Analysis of Inorganic Particles>

Composition of inorganic particles to be used was analyzed using an X-ray fluorescence analyzer (X-ray fluorescence analyzer system 3270, manufactured by Rigaku Corporation) to examine Al components and Si components. Note that the amounts of coated Al and Si were obtained by converting the detected amount of metallic compounds of the Al components and the Si components into the amounts of the corresponding oxides (namely, Al components were calculated as $Al_2O_3$, Si components were calculated as $SiO_2$).

<Printability>

The pattern for stretching durability test was consecutively printed on 100 pieces of PET film having a thickness of 125 µm and dried under predetermined conditions. The presence or absence of blurs was visually confirmed on the 95th to 100th printed matters. In addition, the line width and the line interval were measured on the 30th printed matter.

Production Example 1

<Polymerization of Polyester Material>

Into a stainless steel polymerization vessel with an internal volume of 3 L equipped with a stirrer and a condenser for distillation were charged 69.8 parts by mass of terephthalic acid, 93.0 parts by mass of terephthalic acid, 55.9 parts by mass of ethylene glycol, and 62.5 parts by mass of neopentyl glycol, followed by raising a temperature up to 235° C. over 3 hours under a pressure of 2.0 kgf/cm³, and water was distilled off to carry out esterification reaction. After the completion of the esterification reaction, 0.14 parts by mass of titanium tetrabutoxide was added, followed by stirring for 10 minutes. Then, an initial polymerization under a reduced pressure was conducted for 30 minutes until a pressure reached 650 Pa, the temperature was raised up to 255° C., and subsequently, a latter polymerization was further conducted under 130 Pa or less for 45 minutes. After the completion of polymerization, the pressure was adjusted to 1.0×105 Pa with nitrogen and cooled to 200° C. Next, while continuing stirring, 3.8 parts by mass of trimellitic anhydride was added, followed by stirring at 200° C. for 30 minutes. Then, 158 parts by mass of ε-caprolactone was added, followed by stirring at 200° C. for 60 minutes to obtain a polyester resin. The polyester resin R02 thus obtained had a glass transition temperature of −12° C. and a reduced viscosity of 1.1 dl/g.

Production Example 2

<Polymerization of Synthetic Rubber Material>

The following materials were put into a stainless steel reactor equipped with a stirrer and a water cooling jacket and gently stirred while keeping the bath temperature at 15° C. by flowing nitrogen.

| | |
|---|---|
| butadiene | 61 parts by mass |
| acrylonitrile | 39 parts by mass |

-continued

| | |
|---|---|
| deionized water | 270 parts by mass |
| sodium dodecylbenzenesulfonate | 0.5 part by mass |
| sodium naphthalenesulfonate condensate | 2.5 parts by mass |
| t-dodecyl mercaptan | 0.3 part by mass |
| triethanolamine | 0.2 part by mass |
| sodium carbonate | 0.1 part by mass |

Next, an aqueous solution prepared by dissolving 0.3 part by mass of potassium persulfate in 19.7 parts by mass of deionized water was added dropwise into the reactor over 30 minutes, reaction was further continued for 20 hours, an aqueous solution prepared by dissolving 0.5 part by mass of hydroquinone in 19.5 parts by mass of deionized water was then added thereto, and an operation for stopping the polymerization reaction was carried out.

Next, in order to distill off unreacted monomers, the pressure in the reactor was first reduced, and then steam was introduced into the reactor to recover the unreacted monomers, thereby to obtain a synthetic rubber latex (L1) composed of NBR.

Sodium chloride and dilute sulfuric acid were added to the obtained latex, aggregation and filtration were performed. Then, deionized water in an amount 20 times in volume ratio to the resin was divided in five times, the resin was washed by repeating re-dispersion in the deionized water and filtration, and dried in air to obtain a synthetic rubber resin. The obtained synthetic rubber resin had a nitrile content of 39% by mass, a Mooney viscosity of 51, and an elastic modulus of 42 MPa.

[Preparation 1 of Conductive Paste]

Using the materials as shown in Table 1, stretchable conductive pastes were prepared with the blend ratios as shown in Table 2. First, the binder resin was dissolved in the solvent of a half amount of a predetermined amount, the metal-based particles, the carbon-based particles, and other components were added to the resulting solution, and after preliminary mixing, the mixture was dispersed by a three-roll mill to obtain a paste. The obtained paste was dried under the conditions as shown in Table 2 and evaluated. The results are shown in Table 2.

Likewise, the materials as shown in Table 1 were used, and the blended components were changed to obtain conductive pastes as shown in Table 2.

[Reference Example 1] Preparation of Stretchable Carbon Paste

A carbon paste for an electrode protective layer was prepared according to the composition as shown in Table 2.

[Reference Example 2] Stretchable Insulating Ink (Cover Coat Resin Ink, Ink for Forming an Underlying Layer)

A stretchable insulating ink was prepared according to the composition as shown in Table 2.

Example 1

Figure 2:
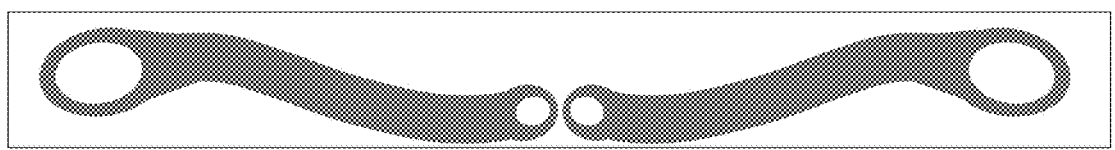
FIG. 2 is a view showing a printed pattern of a cover coat layer in Examples of the present invention.

On a release PET film having a thickness of 125 μm, first, the pattern of FIG. 1 was printed using the carbon paste for forming an electrode surface layer, and dried and cured. Next, the pattern of FIG. 2 was overlaid and printed thereon using the stretchable insulating resin ink for forming a cover coat layer, and dried and cured. Then, the pattern of FIG. 3 was overlaid and printed thereon using the stretchable conductor paste, and finally, the pattern of FIG. 4 for forming an underlying layer was printed using the stretchable insulating paste.

Figure 3:
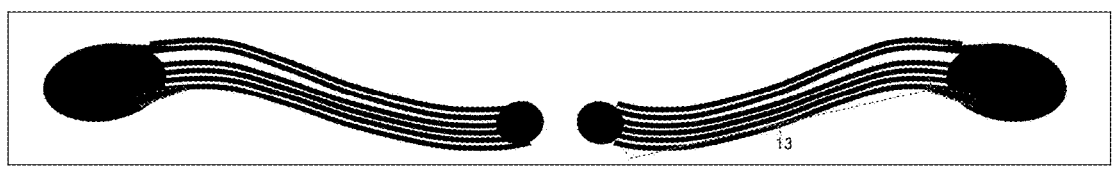
FIG. 3 is a view showing a printed pattern of a conductive layer in Examples of the present invention.

Although FIG. 3 is a schematic view for showing the concept, the wiring portion in the pattern used in the actual test includes 11 wires having a line width of 500 μm arranged in approximately parallel with a line interval of 500 μm.

Figure 4:
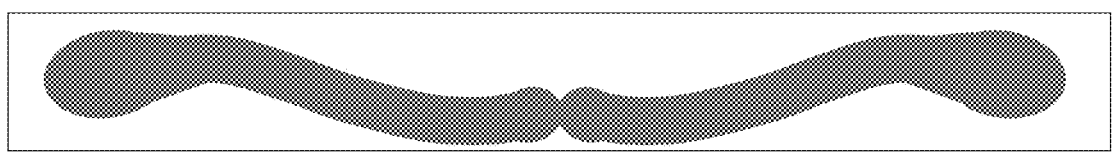
FIG. 4 is a view showing a printed pattern of an underlying layer in Examples of the present invention.

Next, a hot-melt sheet punched into the same shape as the pattern of FIG. 4 was stacked and pressure-bonded to obtain a transferable printed wiring sheet.

The obtained transferable printed wiring sheet was stacked on a predetermined portion of a sports shirt turned inside out and hot-pressed to transfer the printed matter from the release PET film to the sports shirt, whereby a sports shirt with an electrical wiring was obtained.

Subsequently, stainless steel hooks were attached onto a surface side of the sports shirt of the two electrodes positioned at the edges of the center of the chest, and in order to ensure electrical continuity with the wiring portion on a back side of the surface, the stainless steel hooks were electrically connected to the stretchable conductor composition layer using a conductive yarn in which a fine metal wire was twisted.

Heart rate sensor WHS-2 manufactured by Union Tool Co. was connected via the stainless steel hooks, and was programmed so that a heart rate data could be received and displayed with a smartphone manufactured by Apple in which the application "myBeat" designed specifically for the heart rate sensor WHS-2 had been installed. In this way, the sports shirt in which a heart rate measurement function was incorporated was produced.

This shirt was worn by a subject, and electrocardiogram data of the subject was acquired during being at rest, walking, running, riding a bicycle, driving a car, and sleeping. The acquired electrocardiogram data had less noise and a high resolution, and hence had a quality as an electrocardiogram that is capable of analyzing mental states, physical condition, fatigue, sleepiness, stress levels, or the like from the change in heart rate interval, the electrocardiogram waveform, and the like. Furthermore, the sports shirt in which a heart rate measurement function was incorporated obtained in Example 1 retained its function even after machine-washing 100 times. The results are shown in Table 3.

Examples 2 and 3

A sports shirt with an electrical wiring was obtained in the same manner as in Example 1 except that each of the conductive paste 2 and the conductive paste 3 obtained in the preparation of conductive paste was used. The evaluation was performed likewise, and the results are shown in Table 3.

Comparative Example 1

Figure 5:
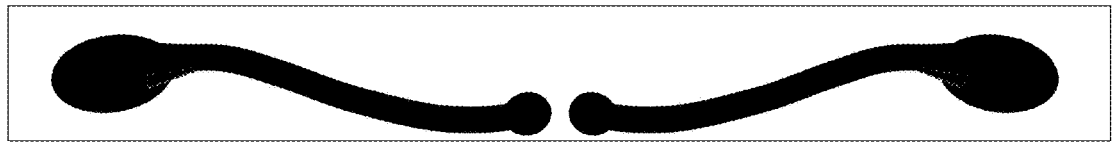
FIG. 5 is a view showing a printed pattern of a conductive layer in Comparative Examples of the present invention.
Figure 6:
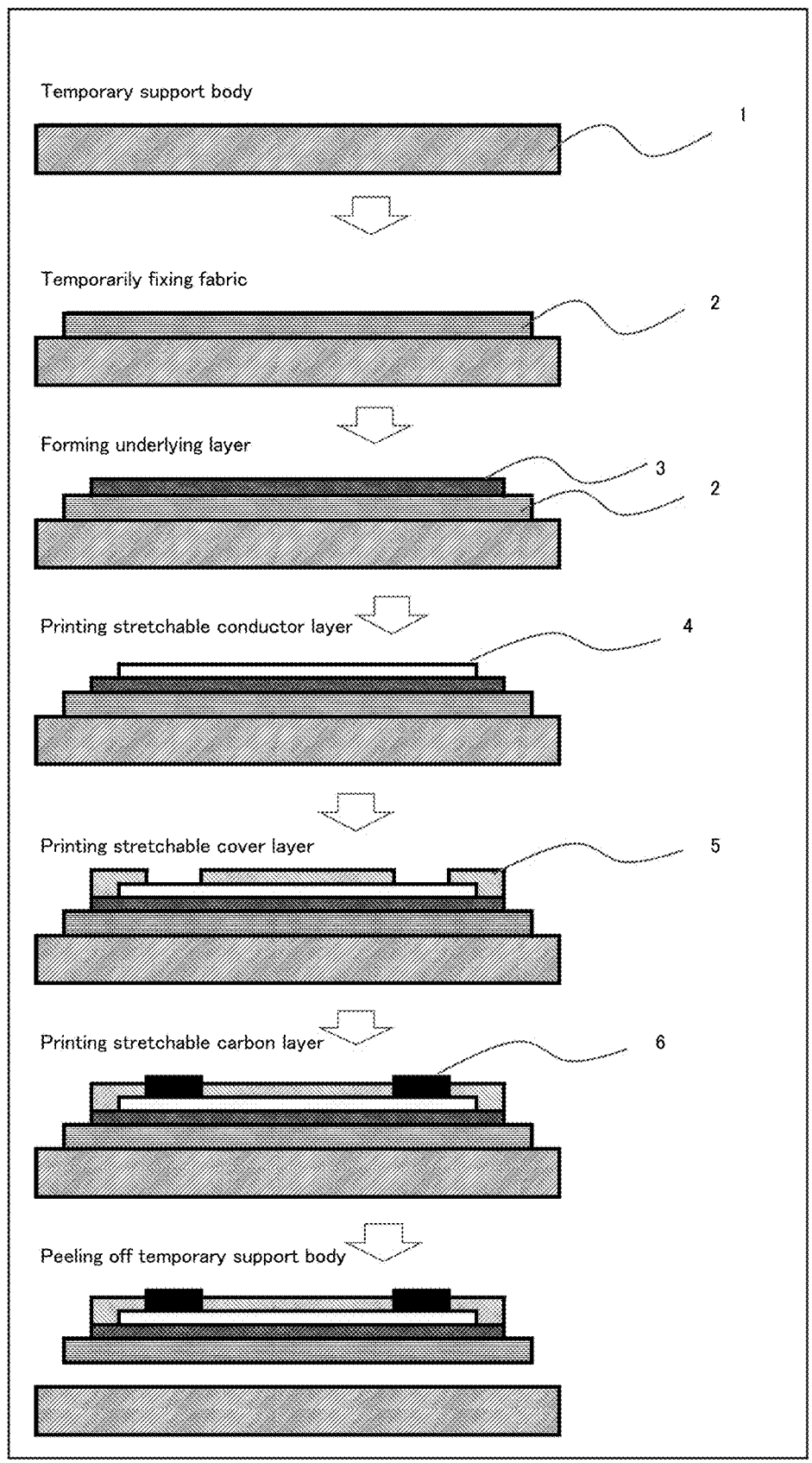
FIG. 6 is a schematic view showing one example of the formation process of an electrical wiring in the present invention (direct printing)
Figure 7:
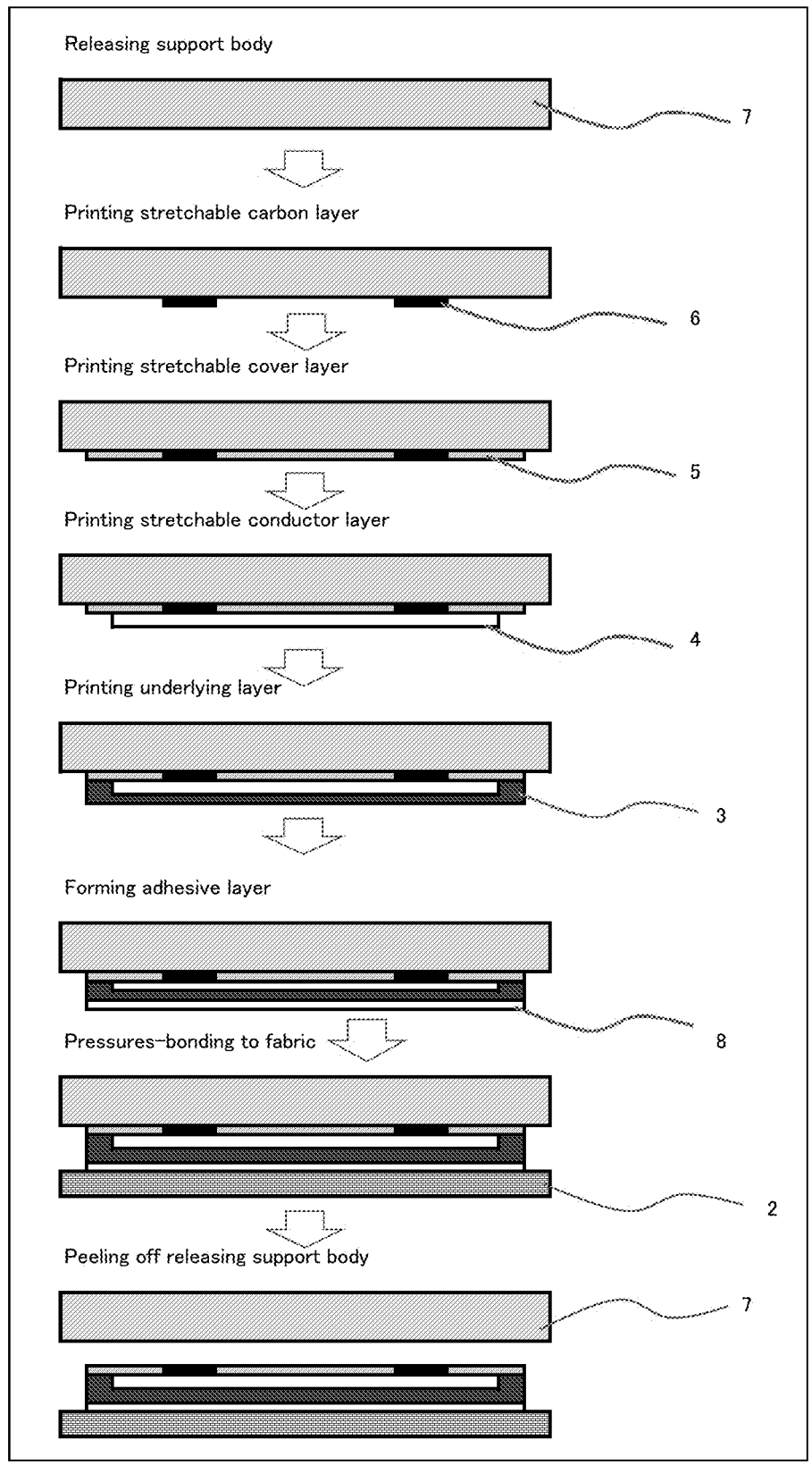
FIG. 7 is a schematic view showing one example of the formation process of an electrical wiring in the present invention (transfer method)
Figure 8:
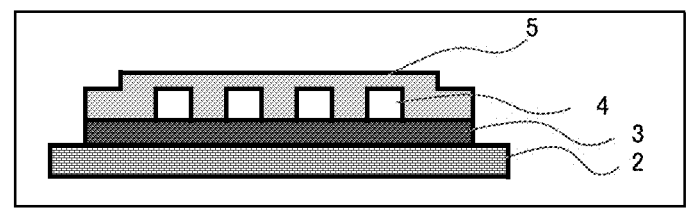
FIG. 8 is a schematic view showing one example of a cross section of a wiring portion of the present invention (direct printing)
Figure 9:
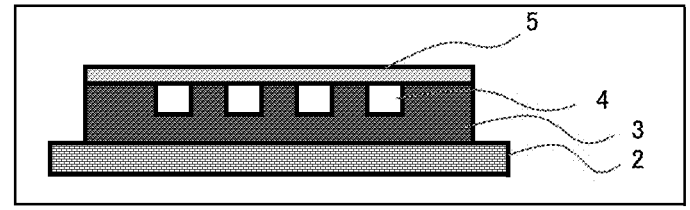
FIG. 9 is a schematic view showing one example of a cross section of a wiring portion of the present invention (transfer method)
Figure 10:
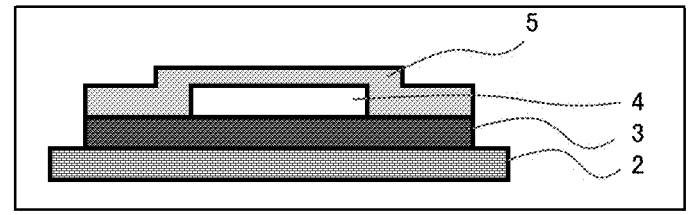
FIG. 10 is a schematic view showing a cross section of a conventional wiring portion (direct printing)
Figure 11:
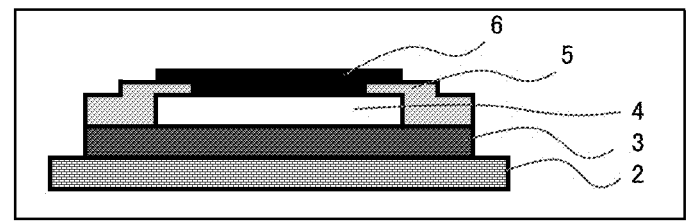
FIG. 11 is a schematic view showing one example of a cross section of an electrode portion of the present invention (direct printing)
Figure 12:
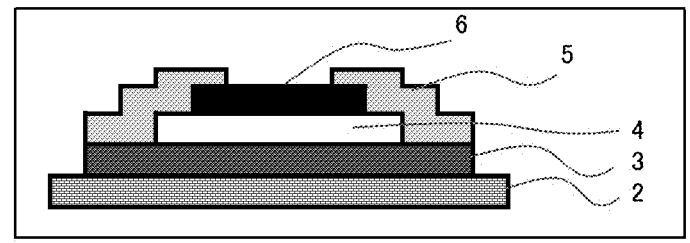
FIG. 12 is a schematic view showing one example of a cross section of an electrode portion of the present invention (direct printing)
Figure 13:
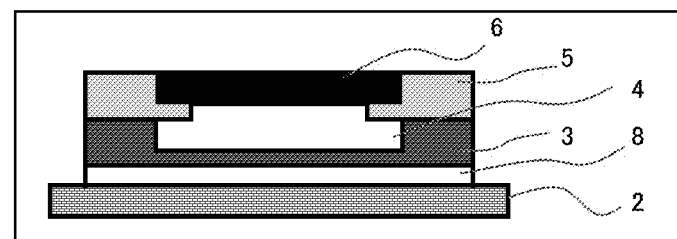
FIG. 13 is a schematic view showing one example of a cross section of an electrode portion of the present invention (transfer method)
Figure 14:
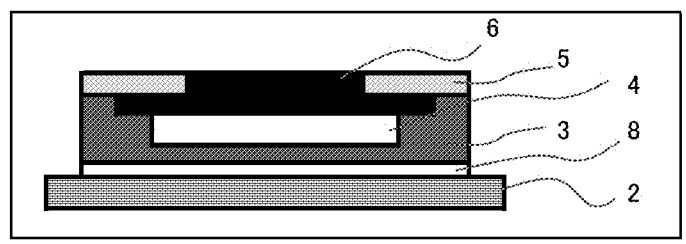
FIG. 14 is a schematic view showing one example of a cross section of an electrode portion of the present invention (transfer method).

A sports shirt with an electrical wiring was obtained in the same manner as in Example 1 except that the pattern of FIG. 5 was used instead of the pattern of FIG. 3. The evaluation was performed likewise, and the results are shown in Table 3.

Example 4

Onto a polyester plain weave cloth having a size of 100 mm×200 mm, the same size polyurethane sheet having a thickness of 100 μm was bonded with a hot-melt adhesive, and using a polyurethane sheet surface as a surface to be printed, 50 parallel lines having a length of 180 mm, a line width of 100 μm and a line interval of 100 μm were printed by screen printing, and dried and cured. Subsequently, a cover coat pattern having a size of 160 mm×80 mm was formed by screen printing using an insulating ink so that the ends of the parallel lines were exposed, and dried and cured to obtain a test piece. The obtained test piece was tested for washing resistance. The results are shown in Table 4.

[Examples 5 to 10] [Comparative Examples 2 and 3]

Wirings of Examples 5 to 10 and Comparative Examples 2 and 3 having different line widths and different line intervals were formed by screen printing in the same manner as in Example 4 except that the wiring pattern and printing thickness were changed, and evaluated for washing resistance. The results are shown in Table 4.

Examples 11 to 23, Comparative Examples 11 to 19, Reference Examples 1 and 2

[Preparation 2 of Conductive Paste]

Using the materials as shown in Table 1, stretchable conductive pastes were prepared with the blend ratios as shown in Tables 5 and 6. First, the binder resin was dissolved in the solvent of a half amount of a predetermined amount, the metal-based particles, the carbon-based particles, and other components were added to the resulting solution, and after preliminary mixing, the mixture was dispersed by a three-roll mill to obtain a paste. The obtained paste was dried under the conditions as shown in Tables 5 and 6 and evaluated. The results are shown in Tables 5 and 6.

Application Example

First, a predetermined pattern was printed on a release PET film having a thickness of 125 μm using the insulating resin ink for forming a cover coat layer prepared in Reference Example 2, and dried and cured. The pattern corresponded to a land section that covers the periphery of an electrode portion in a ring shape and an insulating coating section that covers an electrical wiring portion formed of the stretchable conductor. The land section covered the outer circumference 3 mm of an electrode pattern described later, and had a ring width of 5 mm. The insulating coating section had a width of 24 mm and covered the stretchable conductor wiring. The dry thickness of the cover coat layer was adjusted to be 20 μm.

Next, using the stretchable carbon paste obtained in Reference Example 1, printing was performed on a portion to be an electrode portion, followed by drying and curing. The electrode portion was a circle having a diameter of 40 mm arranged concentrically with the ring of the previously printed cover coat layer.

Next, the electrode portion and the electrical wiring portion were printed using the paste for forming a stretchable conductor obtained in Example 12. The electrode portion had a circular shape with a diameter of 40 mm, and was arranged concentrically with the ring-shaped land section. The electrical wiring portion was in the form of stripes in which ten wires having a line width of 0.8 mm and a line interval of 1 mm were arranged in parallel. The electrode portion and the electrical wiring portion after printing were dried and cured by performing heat treatment at 115° C. for 15 minutes in a drying oven. The dry thickness was adjusted to be 35 μm.

Furthermore, using the insulating resin ink of Reference Example 2 used for the cover coat layer, printing was performed so as to cover all the printed patterns including the cover coat layer, followed by drying at 115° C. for 15 minutes. A hot-melt sheet with a release film "Ecellent SHM104-PUR" (thickness: 70 μm) manufactured by NTW Co., Ltd. was punched out into a predetermined shape and stacked on the obtained printed matter, and they were heated from the release film side with an iron to lightly attach to each other.

Subsequently, the transferable printed electrode wiring obtained by the above processes was overlaid on a predetermined portion of the sports shirt turned inside out and hot-pressed at 120° C. to transfer the printed matter from the release PET film to the sports shirt, whereby a sports shirt with an electrical wiring was obtained.

In the obtained sports shirt with an electrical wiring, the circular electrode having a diameter 50 mm was placed on the intersection of each of left and right posterior axillary lines and the seventh rib, and the electrical wiring in the form of stripes formed of the stretchable conductor composition was formed from each of the circular electrodes to the center of the chest on the inside of the sports shirt. The wirings extending from the left and right electrodes to the center of the back of the neck had a rectangle with a side of 20 mm at the center side of the chest, and the left and right electrodes are not short-circuited due to the gap of 5 mm therebetween.

Subsequently, stainless steel hooks were attached on a surface side of the sports shirt at the edges of the center of the back of the neck of the left and right wiring portions where no cover coat layer was disposed, and in order to ensure electrical continuity with the wiring portion on a back side of the surface, the stainless steel hooks were electrically connected to the stretchable conductor composition layer using a conductive yarn in which a fine metal wire was twisted.

Heart rate sensor WHS-2 manufactured by Union Tool Co. was connected via the stainless steel hooks, and was programmed so that a heart rate data could be received and displayed with a smartphone manufactured by Apple in which the application "myBeat" designed specifically for the heart rate sensor WHS-2 had been installed. In this way, the sports shirt in which a heart rate measurement function was incorporated was produced.

This shirt was worn by a subject, and electrocardiogram data of the subject was acquired during being at rest, walking, running, riding a bicycle, driving a car, and sleeping. The acquired electrocardiogram data had less noise and a high resolution, and hence had a quality as an electrocardiogram that is capable of analyzing mental states, physical condition, fatigue, sleepiness, stress levels, or the like from the change in heart rate interval, the electrocardiogram waveform, and the like.

Furthermore, the sports shirt in which a heart rate measurement function was incorporated obtained in this Application Example retained its function even after machine-washing 30 times.

TABLE 1

| | | |
|---|---|---|
| Carbon-based particles | CB01 | Graphite powder manufactured by Lion Specialty Chemicals Co., Ltd. Ketchen black EC600JD BET specific surface area 1270(m2/g) DOP oil absorption 495 |
| | CB02 | Graphite powder manufactured by Lion Specialty Chemicals Co., Ltd. Ketchen black EC300J BET specific surface area 800(m2/g) DOP oil absorption 360 |
| | CB03 | Graphite powder manufactured by Lion Specialty Chemicals Co., Ltd. Ketchen black EC200L BET specific surface area 620(m2/g) DOP oil absorption300 |
| | CB04 | Acetylene black manufactured by Denki Kagaku KK DBP oil absorption 210 |
| | CB05 | Carbon black manufactured by Mitsubishi Chemical Corporation RCF#52 DBP oil absorption 63 |
| Metal-based particles | Ag01 | Small-diameter silver powder SPH02J (average particle diameter 1.2 μm) manufactured by Mitsui Mining & Smelting Co., Ltd. |
| | Ag02 | Fine flaky silver powder manufactured by Fukuda Metal Foil Powder Industry Co., Ltd. Ag-A (average particle diameter 3.5 μm) |
| | Ag03 | Aggregated silver powder G-35 (average particle diameter 6.0 μm) manufactured by Dowa Electronics Co., Ltd. |
| Inorganic particles | TiO2 | SiO2•Al2O3 surface-treated titanium oxide particles manufactured by Sakai Chemical Industry Co., Ltd. R-38L |
| Binder resin | R01 | Coatron KYU-1 manufactured by Sanyo Chemical Industries, Ltd. Glass transition temperature −35° C. |
| | R02 | Polyester resin obtained in Production Example 1 Glass transition temperature −12° C. |
| | R03 | Nitrile butadiene rubber resin obtained in Production Example 2. Glass transition temperature −29° C. |
| Crosslinking agent | HD | DMP/DEM hybrid blocked isocyanate 7992 manufactured by Baxenden Chemicals Limited |
| Solvent | BC | Butyl carbitol acetate Boiling point 230° C. Vapor pressure(20° C.)3.0 Pa |
| | ECA | Ethylene glycol monoethyl ether acetate Boiling point 217° C. Vapor pressure(20° C.)5.6 Pa |
| | BnOH | Benzyl alcohol Boiling point 205° C. Vapor pressure(20° C.) 3.0 Pa |
| | IP | Isophorone Boiling point 215° C. Vapor pressure(20° C.)40 Pa |

TABLE 2

| | | | Conductive Paste 1 | Conductive Paste 2 | Conductive Paste 3 | Carbon Paste | Insulating Paste |
|---|---|---|---|---|---|---|---|
| Paste composition ratio | Binder resin | R01 | 10 | — | — | — | — |
| | | R02 | — | 10 | — | 30 | 59.5 |
| | | R03 | — | — | 10 | — | — |
| | Crosslinking agent | HD | — | — | — | — | 0.5 |
| | Metal-based particles | Ag01 | 70 | 70 | 69 | — | — |
| | | Ag02 | — | — | — | — | — |
| | | Ag03 | — | — | — | — | — |
| | Carbon-based particles | CB01 | 1 | 1 | 1 | 10 | — |
| | | CB05 | — | — | — | 10 | — |
| | Inorganic particles | TiO2 | — | — | 1 | — | — |
| | Solvent | BC | 19 | — | — | — | — |
| | | ECA | — | 19 | — | 50 | 40 |
| | | BnOH | — | — | 19 | — | — |
| Dry condition | Heat treatment temperature | ° C. | 100 | 100 | 100 | 100 | 100 |
| | Time | minutes | 20 | 20 | 20 | 20 | 20 |
| | Specific resistance | μΩ cm | 280 | 350 | 320 | — | — |
| Characteristics | Stretching durability (Resistance change ratio) | 20% elongation 10 times | 2.8 | 1.9 | 2.8 | — | — |
| | | 20% elongation 30 times | 4.2 | 3.8 | 43 | — | — |
| | | 20% elongation 100 times | 5.7 | 5.4 | 6.0 | — | — |
| | Thickness | μm | 18.9 | 20.0 | 20.2 | — | — |
| | Line widths | μm | 532 | 530 | 518 | — | — |
| | Line intervals | μm | 468 | 470 | 482 | — | — |
| | Presence or absence of blurs | visual observation | none | none | none | — | — |

TABLE 3

| | | Example 1 | Example 2 | Example 3 | Comparative Example 1 |
|---|---|---|---|---|---|
| Conductive Paste | | Conductive Paste 1 | Conductive Paste 2 | Conductive Paste 3 | Conductive Paste 1 |
| Wiring poriton line width | μm | 500 | 500 | 500 | 5000 |
| Wiring poriton line interval | μm | 500 | 500 | 500 | — |
| Number of wiring | number | 11 | 11 | 11 | 1 |

TABLE 3-continued

|  |  | Example 1 | Example 2 | Example 3 | Comparative Example 1 |
|---|---|---|---|---|---|
| Electrocardiogram waveform | | good | good | good | good |
| Wearing feeling | | good | good | good | fair |
| Washing resistance | 10 times | good | good | good | good |
|  | 20 times | good | good | good | good |
|  | 40 times | good | good | good | poor |
|  | 80 times | good | good | good | poor |
|  | 100 times | good | good | good | poor |

TABLE 4

|  |  | Example 4 | Example 5 | Example 6 | Example 7 | Example 8 | Example 9 | Example 10 | Comparative Example 2 | Comparative Example 3 |
|---|---|---|---|---|---|---|---|---|---|---|
| Conductive Paste | | Conductive Paste 1 | Conductive Paste 1 | Conductive Paste 1 | Conductive Paste 1 | Conductive Paste 1 | Conductive Paste 1 | Conductive Paste 1 | Conductive Paste 1 | Conductive Paste 1 |
| Wiring poriton line width | μm | 100 | 200 | 300 | 500 | 800 | 500 | 1200 | 1200 | 2000 |
| Wiring poriton line interval | μm | 100 | 200 | 300 | 500 | 800 | 100 | 100 | 1200 | 2000 |
| Number of wiring | number | 50 | 25 | 17 | 10 | 7 | 10 | 4 | 4 | 2 |
| Wiring thickness | μm | 25 | 26 | 25 | 28 | 30 | 30 | 30 | 30 | 30 |
| Insulating layer thickness | μm | 20 | 20 | 20 | 22 | 23 | 23 | 23 | 25 | 25 |
| Washing resistance | 10 times | good | good | good | good | good | good | good | good | good |
|  | 20 times | good | good | good | good | good | good | good | good | good |
|  | 40 times | good | good | good | good | good | good | good | poor | poor |
|  | 80 times | good | good | good | good | good | good | good | poor | poor |
|  | 100 times | good | good | good | good | good | good | poor | poor | poor |

TABLE 5

|  |  |  | Example 11 | Example 12 | Example 13 | Example 15 | Example 16 | Example 17 |
|---|---|---|---|---|---|---|---|---|
| Paste composition ratio | Binder resin | R01 | 10 | — | — | 10 | — | — |
|  |  | R02 | — | 10 | — | — | 10 | 10 |
|  |  | R03 | — | — | 10 | — | — | — |
|  |  | R04 | — | — | — | — | — | — |
|  | Crosslinking agent | HD | — | — | — | — | — | — |
|  | Metal-based particles | Ag01 | 70 | — | 70 | — | 70 | 70 |
|  |  | Ag02 | — | 70 | — | 70 | — | — |
|  |  | Ag03 | — | — | — | — | — | — |
|  | Carbon-based particles | CB01 | 1 | 1 | 1 | 1 | 0.6 | 1.3 |
|  |  | CB02 | — | — | — | — | — | — |
|  |  | CB03 | — | — | — | — | — | — |
|  |  | CB04 | — | — | — | — | — | — |
|  |  | CB05 | — | — | — | — | — | — |
|  | Solvent | BC | 19 | — | — | 19 | — | — |
|  |  | ECA | — | 19 | — | — | 19.4 | 18.2 |
|  |  | BnOH | — | — | 19 | — | — | — |
|  |  | IP | — | — | — | — | — | — |
| Dry condition | Heat treatment temperature | ° C. | 100 | 100 | 100 | 100 | 100 | 100 |
|  | Time | min | 20 | 20 | 20 | 20 | 20 | 20 |
| Characteristics | Stretching durability | Resistance change ratio | 3.5 | 3.8 | 3.6 | 5.0 | 7.0 | 4.0 |
|  | Thickness | μm | 15.0 | 15.4 | 14.8 | 16.4 | 14.0 | 16.7 |
|  | Line widths | μm | 510 | 513 | 508 | 524 | 535 | 498 |
|  | Line intervals | μm | 490 | 487 | 492 | 476 | 465 | 502 |
|  | Presence or absence of blurs | Visual observation | none | none | none | none | none | none |

TABLE 5-continued

| | | | Example 18 | Example 19 | Example 20 | Example 21 | Example 22 | Example 23 |
|---|---|---|---|---|---|---|---|---|
| Paste composition ratio | Binder resin | R01 | — | 10 | 10 | — | — | — |
| | | R02 | 10 | — | — | 10 | 10 | 10 |
| | | R03 | — | — | — | — | — | — |
| | | R04 | — | — | — | — | — | — |
| | Crosslinking agent | HD | — | — | — | — | — | — |
| | Metal-based particles | Ag01 | — | 70 | 70 | 70 | 70 | 70 |
| | | Ag02 | 70 | — | — | — | — | — |
| | | Ag03 | — | — | — | — | — | — |
| | Carbon-based particles | CB01 | — | — | — | 1 | 1 | 1 |
| | | CB02 | 1 | — | — | — | — | — |
| | | CB03 | — | 1 | — | — | — | — |
| | | CB04 | — | — | 1 | — | — | — |
| | | CB05 | — | — | — | — | — | — |
| | Solvent | BC | — | 19 | 19 | — | — | — |
| | | ECA | 19 | — | — | 19 | 19 | 19 |
| | | BnOH | — | — | — | — | — | — |
| | | IP | — | — | — | — | — | — |
| Dry condition | Heat treatment temperature | °C. | 100 | 100 | 100 | 80 | 120 | 140 |
| | Time | min | 20 | 20 | 20 | 45 | 18 | 15 |
| Characteristics | Stretching durability | Resistance change ratio | 7.7 | 8.0 | 8.2 | 3.5 | 3.7 | 4 |
| | Thickness | μm | 14.2 | 13.6 | 18.6 | 18.9 | 16.2 | 14.5 |
| | Line widths | μm | 532 | 540 | 535 | 516 | 524 | 535 |
| | Line intervals | μm | 468 | 460 | 465 | 484 | 476 | 465 |
| | Presence or absence of blurs | Visual observation | none | none | none | none | none | none |

TABLE 6

| | | | Comparative Example 11 | Comparative Example 12 | Comparative Example 13 | Comparative Example 14 | Comparative Example 15 | Comparative Example 16 |
|---|---|---|---|---|---|---|---|---|
| Paste composition ratio | Binder resin | R01 | — | — | 9.5 | — | — | — |
| | | R02 | 10 | 10 | — | 10 | 10 | 10 |
| | | R03 | — | — | — | — | — | — |
| | | R04 | — | — | — | — | — | — |
| | Crosslinking agent | HD | — | — | 0.5 | — | — | — |
| | Metal-based particles | Ag01 | 70 | 70 | 70 | 70 | 70 | 70 |
| | | Ag02 | — | — | — | — | — | — |
| | | Ag03 | — | — | — | — | — | — |
| | Carbon-based particles | CB01 | — | — | 1 | 0.3 | 0.1 | 2.2 |
| | | CB02 | — | — | — | — | — | — |
| | | CB03 | — | — | — | — | — | — |
| | | CB04 | — | — | — | — | — | — |
| | | CB05 | 1 | — | — | — | — | — |
| | Solvent | BC | — | — | 19 | — | — | — |
| | | ECA | 19 | 20 | — | 19.6 | 19.8 | 18.8 |
| | | BnOH | — | — | — | — | — | — |
| | | IP | — | — | — | — | — | — |
| Dry condition | Heat treatment temperature | °C. | 100 | 100 | 100 | 100 | 100 | 100 |
| | Time | min | 20 | 20 | 20 | 20 | 20 | 20 |
| Characteristics | Stretching durability | Resistance change ratio | 15.0 | 16.0 | 15.0 | 14.0 | 14.7 | 16.5 |
| | Thickness | μm | 12.0 | 12.3 | 15.1 | 13.8 | 12.4 | 17.3 |
| | Line widths | μm | 550 | 555 | 512 | 538 | 540 | 480 |
| | Line intervals | μm | 450 | 445 | 488 | 462 | 460 | 520 |
| | Presence or absence of blurs | Visual observation | none | none | none | none | none | presence |

| | | | Comparative Example 17 | Comparative Example 18 | Comparative Example 19 | Reference Example 1 | Reference Example 2 |
|---|---|---|---|---|---|---|---|
| Paste composition ratio | Binder resin | R01 | — | — | — | — | — |
| | | R02 | 10 | — | 10 | 30 | 59.5 |
| | | R03 | — | 10 | — | — | — |
| | | R04 | — | — | — | — | — |
| | Crosslinking agent | HD | — | — | — | — | 0.5 |

TABLE 6-continued

| | | | | | | | |
|---|---|---|---|---|---|---|---|
| | Metal-based particles | Ag01 | 70 | 70 | — | — | — |
| | | Ag02 | — | — | — | — | — |
| | | Ag03 | — | — | 70 | — | — |
| | Carbon-based particles | CB01 | 3 | 1 | 1 | 20 | — |
| | | CB02 | — | — | — | — | — |
| | | CB03 | — | — | — | — | — |
| | | CB04 | — | — | — | — | — |
| | | CB05 | — | — | — | — | — |
| | Solvent | BC | — | — | — | — | — |
| | | ECA | 17 | — | 19 | 50 | 40 |
| | | BnOH | — | — | — | — | — |
| | | IP | — | 19 | — | — | — |
| Dry condition | Heat treatment temperature | °C. | 100 | 100 | 100 | — | — |
| | Time | min | 20 | 20 | 20 | — | — |
| Characteristics | Stretching durability | Resistance change ratio | 18.0 | — | — | — | — |
| | Thickness | μm | 18.1 | 15.5 | 14.5 | — | — |
| | Line widths | μm | 470 | 512 | 529 | — | — |
| | Line intervals | μm | 530 | 488 | 471 | — | — |
| | Presence or absence of blurs | Visual observation | presence | presence | presence | — | — |

INDUSTRIAL APPLICABILITY

As described above, the wearable smart device according to the present invention is a garment with an electrical wiring exhibiting good washing durability by providing an electrical wiring that has stretchability and in addition that is formed of a stretchable conductor having a narrow line interval and a narrow line width. This indicates that the electrical wiring portion is excellent in repeated bending properties, repeated twisting properties, repeated stretching properties, and repeated compression properties, and further has a small discomfort when being worn.

The technique of the wearable smart device according to the present invention is applicable to a wearable device for detecting information of a human body such as bioelectric potential including myoelectric potential and cardiac potential, and biological information including body temperature, pulse, blood pressure, and the like with a sensor or the like provided in a garment; a garment incorporating an electric heating device; a wearable device incorporating a sensor for measuring a clothing pressure; wear that measures a body size by using a clothing pressure; a sock-type device for measuring a pressure of a sole of foot; a garment in which flexible solar cell modules are integrated in textiles; a wiring part of a tent, bag or the like; a low frequency treatment apparatus having a joint part; a wiring part of a thermal treatment apparatus or the like; a sensing part of degree of flexion, and the like. Such wearable devices can be used for not only a human body but also an animal such as pet or livestock, can be applied to a mechanical device having an expandable portion, a bending portion, and the like, and can also be used as an electrical wiring of a system that is used by connecting a mechanical device such as a robotic prosthetic arm or leg to a human body. In addition, it can be also used as a wiring material for an implant device to be embedded in the body.

REFERENCE SIGNS LIST

1 Temporary support
2 Fabric (substrate)
3 Underlying layer
4 Conductive layer
5 Insulating layer (cover coat layer)
6 Electrode surface layer (carbon layer)
7 Release film
8 Adhesive layer (hot-melt layer)
11 Electrode for detecting heart rate
12 Electrode for mounting device
13 Wiring portion

The invention claimed is:

1. A wearable smart device comprising a stretchable electrical wiring comprising a stretchable conductor composition capable of maintaining electrical continuity even after repeating 20% elongation 10 times,
   wherein the stretchable conductor composition comprises carbon black, and
   wherein the electrical wiring when unstretched has a line interval of 50 μm or more and 1 mm or less, and the electrical wiring has a ratio of width/thickness in a range of 1 to 50.

2. The wearable smart device comprising a stretchable electrical wiring according to claim 1, wherein the electrical wiring when unstretched has a line width of 50 μm or more and less than 1 mm.

3. The wearable smart device comprising a stretchable electrical wiring according to claim 1, wherein a portion of the stretchable conductor composition of the stretchable electrical wiring has a thickness in a range of 3 μm or more and 200 μm or less.

4. The wearable smart device comprising a stretchable electrical wiring according to claim 1, wherein a specific resistance of the stretchable conductor composition of the stretchable electrical wiring when unstretched is $1 \times 10^{-3}$ Ωcm or less.

5. The wearable smart device comprising a stretchable electrical wiring according to claim 1, wherein the stretchable conductor composition comprises substantially no solvent and comprises at least 40 to 90% by mass of conductive particles having an average particle diameter of 0.5 μm or more and 5 μm or less, and 15 to 60% by mass of a non-crosslinked elastomer.

6. The wearable smart device comprising a stretchable electrical wiring according to claim 1, wherein the stretchable conductor composition comprises substantially no solvent and comprises at least 40 to 83% by mass of conductive particles having an average particle diameter of 0.5 μm or more and 5 μm or less, and 15 to 60% by mass of a non-crosslinked elastomer.

7. The wearable smart device comprising a stretchable electrical wiring according to claim 1, wherein the stretchable conductor composition comprises substantially no solvent and comprises at least 40 to 90% by mass of conductive particles having an average particle diameter of 0.5 µm or more and 5 µm or less, 15 to 60% by mass of a non-crosslinked elastomer, and 0.5 to 3% by mass of carbon black having a BET specific surface area of 100 to 550 m²/g.

8. A paste for forming a stretchable conductor comprising at least a metal-based conductive filler, carbon black not covered with metal, a non-crosslinked elastomer, and an organic solvent,
wherein the metal-based conductive filler has an average particle diameter of 0.5 µm or more and 5 µm or less.

9. The paste for forming a stretchable conductor according to claim 8,
wherein the carbon black has a DBP oil absorption in a range of 100 to 550 cm³/100 g, and
wherein an amount ratio of the carbon black is 0.5 to 2.0% by mass relative to a total amount of the metal-based conductive filler and the carbon black.

10. A paste for forming a stretchable conductor comprising at least a metal-based conductive filler, carbon black, a non-crosslinked elastomer, and an organic solvent,
wherein the metal-based conductive filler has an average particle diameter of 0.5 µm or more and 5 µm or less, and
when a total amount of all components except the solvent is 100 parts by mass, a total amount of the metal-based conductive filler and the carbon black is 40 to 90 parts by mass, and an amount of the non-crosslinked elastomer is 10 to 60 parts by mass.

11. A paste for forming a stretchable conductor comprising at least a metal-based conductive filler, a non-crosslinked elastomer, and an organic solvent,
wherein the metal-based conductive filler has an average particle diameter of 0.5 µm or more and 5 µm or less, and
the organic solvent has a boiling point of 200° C. or higher and a saturated vapor pressure at 20° C. of 20 Pa or less.

12. A method for producing a stretchable electrical wiring, the method comprising:
forming an electrical wiring having a line width of less than 1 mm and a line interval of 1 mm or less by a printing method using a paste for forming a stretchable conductor, and
then drying the electrical wiring at a temperature in a range of 75° C. to 145° C. under atmospheric pressure,
wherein the paste for forming the stretchable conductor comprises at least a metal-based conductive filler, a non-crosslinked elastomer, and an organic solvent, and
wherein the metal-based conductive filler has an average particle diameter of 0.5 µm or more and 5 µm or less.

* * * * *